United States Patent [19]

Miura

[11] Patent Number: 4,860,433
[45] Date of Patent: Aug. 29, 1989

[54] METHOD OF MANUFACTURING AN INDUCTANCE ELEMENT

[75] Inventor: Norio Miura, Gunma, Japan

[73] Assignee: Sanyo Electric Co., Ltd., Japan

[21] Appl. No.: 84,332

[22] Filed: Aug. 11, 1987

Related U.S. Application Data

[62] Division of Ser. No. 24,880, Mar. 11, 1987, abandoned.

[51] Int. Cl.⁴ ............................................. H01F 7/06
[52] U.S. Cl. ...................................... 29/605; 29/840;
29/850; 29/860; 228/110; 228/176; 228/179;
336/192; 336/200; 336/208
[58] Field of Search ..................... 29/605, 602 R, 850,
29/840, 854–860; 336/192, 200, 65, 198, 208;
228/110, 111, 176, 179

[56] References Cited

U.S. PATENT DOCUMENTS

| | | | |
|---|---|---|---|
| 2,923,859 | 2/1960 | Worth et al. | 29/602 X |
| 3,550,645 | 12/1970 | Keogh | 29/605 X |
| 3,555,477 | 1/1971 | Hildebrandt | 29/605 X |
| 3,590,480 | 7/1971 | Johnson, Jr. et al. | 29/605 |
| 3,623,649 | 11/1971 | Keisling | 228/110 X |
| 3,673,681 | 7/1972 | Steranko | 29/840 |
| 4,149,135 | 4/1979 | Roespel et al. | 29/605 X |

FOREIGN PATENT DOCUMENTS 87810  5/1983  Japan .................. 29/602.1

Primary Examiner—Carl E. Hall
Attorney, Agent, or Firm—Darby & Darby

[57] ABSTRACT

An inductance element comprises conductive paths of copper and a spool member arranged on a substrate, and insulated winding formed by a fine copper wire whose surface is coated with an insulating film of urethane etc. is wound around the spool member so that both end portions thereof are subjected to ultrasonic vibration by an ultrasonic bonding apparatus to be connected to the conductive paths by ultrasonic bonding. Thus, the end portions of the winding can be processed by local heating with application of ultrasonic vibration, whereby the coil needs not be entirely heated and an inductance element can be readily implemented directly on the substrate.

14 Claims, 9 Drawing Sheets

METHOD OF MANUFACTURING AN INDUCTANCE ELEMENT

This is a division, of application Ser. No. 024,880, filed Mar. 11, 1987, now abandoned.

BACKGROUND OF THE INVENTION

1. Field of the Invention

The present invention relates to an inductance element and a method of manufacturing the same. More specifically, it relates to an inductance element which comprises a coil formed by winding a conductor directly on a substrate and a method of manufacturing the same.

2. Description of the Prior Art

In recent years, electronic circuits have been subjected to hybrid integration with improvement of chip elements. A hybrid integrated circuit includes a semiconductor integrated circuit and its external components such as a capacitor, a resistor and a coil packaged in a unit, thereby to remarkably reduce the number of components of electronic equipment and simplify assembling, maintenance and inspection thereof.

However, an inductance element is backward in miniaturization. In a coil formed by winding a conductor to be packaged as a chip element on a substrate by solder dipping, there remain unsolvable problems with respect to heat resistance of the insulating layer coating the conductor and connection of the conductor with external terminals.

Examples of conventional miniature inductance elements are well known in the art by, for example, "Low Cost, High Frequency Radio Frequency Transformer" disclosed in U.S. Pat. No. 4,134,091 granted to Rogers, "Wire Coil Assembly for an Electrical Circuit" in U.S. Pat. No. 4,229,722 to Olsen, "Miniature High Frequency Coil Assembly or Transformer" in U.S. Pat. No. 4,245,207 to Murakami et al. and Japanese Patent Laying-open Gazette No. 92807/1982.

FIGS. 1 to 3 are sectional views respectively showing conventional miniature inductance elements.

The miniature inductance element as shown in FIG. 1 comprises a magnetic substance such as a drum-shaped core 1 and winding 2 wound around the same. Both ends 3 of the winding 2 are bent along the surfaces of silver electrodes 5 formed on the end surfaces of flange portions 4 on both ends of the core 1, so that the ends 3 of the winding 2, the silver electrodes 5 and lead wires 7 are electrically connected with each other through solder 6.

FIG. 2 shows another conventional miniature inductance element which comprises a drum-shaped core 1 provided in the bottom surface of its flange portion 4 with protruding lead wires 7 and winding 2, both end portions 3 of which are respectively wound around the lead wires 7 to be connected thereto through solder 6.

Both miniature inductance elements as shown in FIGS. 1 and 2 require the lead wires 7 and the solder 6, and cannot be miniaturized like a chip resistor and a chip capacitor.

FIG. 3 shows a chip inductance element which has been proposed by Japanese Patent Laying-open Gazette No. 43513/1984. The miniature inductance element as shown in FIG. 3 comprises a drum-shaped core 1 and winding 2 wound around the same. The core 1 is provided in the bottom surface of its flange portion 4 with silver electrodes 5 at a prescribed interval so that end portions of the winding 2 are bent along the surfaces of the silver electrodes 5 to be connected thereto by solder 6. The chip inductance element as shown in FIG. 3 is fixed to a desired electrode on a circuit substrate through the solder 6 on the silver electrodes 5.

In the aforementioned miniature and chip inductance elements, however, insulating coating material for the winding may have been melted by the heat applied to package the elements on circuit substrates by solder, leading to rare short circuits. In the chip inductance element, further, a great amount of solder, which amount cannot be kept constant, may adhere to the silver electrodes 5, whereby the element might be bonded to the circuit substrate in an inclined state.

SUMMARY OF THE INVENTION

Accordingly, the principal object of the present invention is to provide an inductance element and a method of manufacturing the same, which can completely overcome the aforementioned disadvantages of the prior art by connecting end portions of winding with conductive paths by bonding.

An inductance element according to the present invention comprises conductive paths of conductive material provided on a substrate and a coil formed by insulated winding of conductive material coated with an insulating layer. End portions of the insulated winding are locally heated by bonding to be electrically connected to the conductive paths.

According to the present invention, only the end portions of the insulated winding are thus locally heated to be electrically connected with the conductive paths to remove necessity of heating the entire coil, whereby an inductance element is readily implemented as a chip element. In addition, the inductance element can be assembled in a hybrid integrated circuit or the like without heating the coil, to prevent a rare short circuit of the insulated winding of the coil in assembling. According to the present invention, further, the end portions of the insulated winding of the coil are directly connected with the conductive paths, whereby the coil can be highly freely mounted on the substrate and readily assembled therein. The inductance element according to the present invention can be positively assembled in the hybrid integrated circuit etc. to remarkably extend the range of circuits that can be integrated.

In a preferred embodiment of the present invention, a spool member is provided on a substrate so that insulated winding is wound around the spool member, which can serve as a core. The insulated winding is selected to have a circular section so that end portions thereof are in point contact with conductive paths. Therefore, an insulating film covering the winding can be easily separated upon local heating with application of ultrasonic vibration, so that the winding is readily electrically connected to the conductive paths. Further, thickness of the insulated winding is arbitrarily selected in response to the inductance of the coil. Thus, a plurality of inductance elements can be obtained to be in various inductance values by selecting thickness of the insulated winding.

A manufacturing method according to the present invention comprises a first step of preparing a substrate provided with two conductive paths, a second step of mounting insulated winding of conductive material coated with an insulating layer on a reel of a bonding apparatus, a third step of feeding the insulated winding from the reel to bond an end thereof to one of the conductive paths on the substrate, a fourth step of winding the insulated winding to form a coil and a fifth step of bonding the other end of the insulated winding to the other conductive path.

In the method according to the present invention, therefore, the inductance element can be directly provided on the substrate while the same is formed by the minimum number of components such as the conductive paths on the substrate and the insulated winding. Thus, the inductance element can be manufactured in extremely small size at a low cost in comparison with conventional ones.

In the manufacturing method according to the present invention, further, the insulated winding fed from the reel of the bonding apparatus is wound to form the inductance element, which can be provided in a desired number of turns and the inductance value thereof can be arbitrarily selected.

According to the manufacturing method of the present invention, the insulated winding is continuously fed from the reel thereby to continuously manufacture a plurality of inductance elements.

Further, the inductance elements according to the manufacturing method of the present invention can be continuously manufactured on any desired positions of the substrate.

According to the manufacturing method of the present invention, further, the inductance element can be set in a desired inductance value. In other words, the number of turns of the insulated winding can be programmed in a step of manufacturing the inductance element. Thus, the present invention can be extremely conveniently applied to a tuner circuit etc. which requires various inductance values.

In addition, no heating step is required in the process of manufacturing the inductance element according to the present invention. In other words, according to the manufacturing method of the present invention, the insulated winding is locally heated to be connected with the conductive paths by bonding, and hence no rare short circuit is caused by melting of the heated insulating film.

In the manufacturing method according to the present invention, a memory capable of pattern recognition and programming may be added to the bonding apparatus so that a plurality of inductance elements are automatically manufactured so far as the insulated winding is fed from the reel.

In a preferred example of the manufacturing method according to the present invention, the bonding apparatus is implemented by an ultrasonic bonding apparatus, a capillary chip of which is located on one of the conductive paths to bond an end portion of the insulated winding to the conductive path by ultrasonic waves. Then either the capillary chip or the substrate is rotated to form a coil and then the capillary chip is located on the other conductive path to bond the other end of the insulated winding to the other conductive path.

In another example of the manufacturing method according to the present invention, a table of the ultrasonic bonding apparatus is vertically moved to wind the insulated winding, thereby to form the coil in uniform thickness.

In still another example of the manufacturing method according to the present invention, the insulated winding and the conductive paths are formed by the same conductive metal material such as copper, thereby to facilitate ultrasonic bonding.

In a further example of the manufacturing method according to the present invention, a circuit element is soldered to at least one of the two conductive paths, thereby to electrically connect the circuit element and the inductance element.

In a still further example of the manufacturing method according to the present invention, a plurality of inductance elements are formed on the substrate. In other words, the method according to the present invention includes a seventh step of preparing a substrate provided with two conductive paths, an eighth step of mounting insulated winding of conductive material coated with an insulating layer on a reel of a bonding apparatus, a ninth step of bonding an end of the insulated winding to one of the conductive paths, a tenth step of winding the insulated winding on a first position of the substrate to form a first coil, an eleventh step of winding the insulated winding on a second position of the substrate to form a second coil and a twelfth step of bonding the other end of the insulated winding to the other conductive path.

Thus, a plurality of inductance elements can be continuously formed on the substrate according to the manufacturing method of the present invention.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
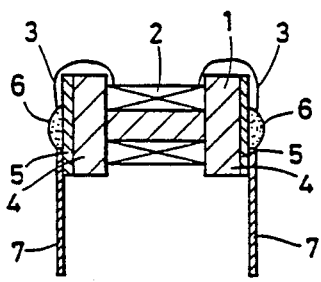
FIGS. 1 and 2 are sectional views showing examples of conventional miniature inductance elements.
Figure 2:
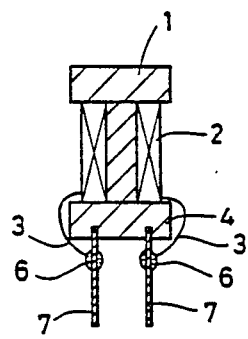
Figure 3:
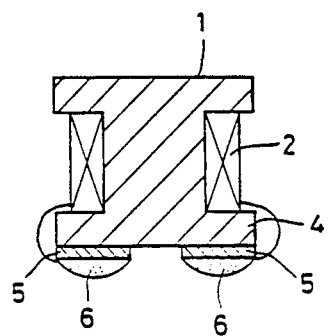
FIG. 3 is a sectional view showing an example of a conventional chip inductance element.
Figure 4:
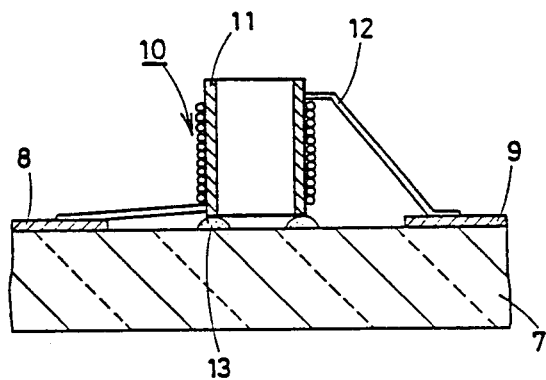
FIG. 4 is a sectional view showing an embodiment of the present invention.
Figure 5:
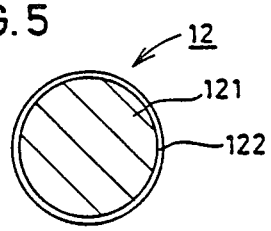
FIG. 5 is a sectional view showing insulated winding applied to a coil according to the embodiment of the present invention.

FIG. 4 is a sectional view showing an embodiment of the present invention and FIG. 5 is a sectional view showing insulated winding applied to a coil according to the embodiment of the present invention, while FIG.

6 is a diagram for illustrating a method of bonding an end of the insulated winding of the coil according to the embodiment of the present invention to a conductive path.

Figure 6:
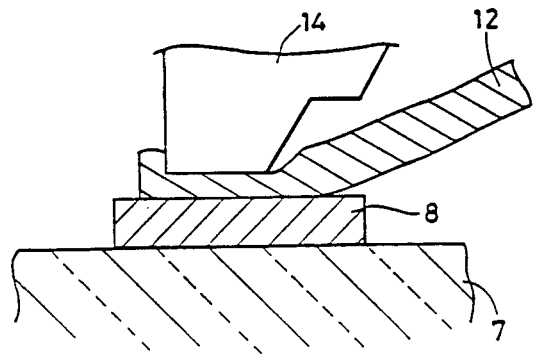
FIG. 6 is a diagram for illustrating a method of bonding an end of the insulating winding of the coil according to the embodiment of the present invention to a conductive path.

Referring to FIGS. 4 to 6, description is made on an inductance element according to an embodiment of the present invention.

As shown in FIG. 4, the inductance element according to the present invention comprises a circuit substrate 7, conductive paths 8 and 9 and a coil portion 10 formed by insulated winding 12 wound around a spool member 11.

The circuit substrate 7 serves as a support substrate, and is formed by a ceramic substrate, a printed substrate of glass epoxy resin or the like or an aluminum substrate whose surface is processed by Alumite. Assembled on the circuit substrate 7 are circuit elements for forming a hybrid integrated circuit etc. such as a semiconductor element, a chip capacitor, a chip resistor and an inductance element.

The conductive paths 8 and 9 are formed on a major surface of the circuit substrate 7 in desired patterns. The conductive paths 8 and 9 serve as pads for bonding the winding 12 of the inductance element, as well as forming paths required for implementing a hybrid integrated circuit. Such conductive paths 8 and 9 are formed in desired patterns by applying copper foil on the major surface of the circuit substrate 7 and selectively etching the same.

The coil portion 10 is formed by winding the insulated winding 12 around the spool member 11 in a desired number of turns. The spool member 11 serves as a bobbin for the insulated winding 12 for forming the inductance element, and may be prepared by a magnetic substance such as ferrite or an insulating layer such as plastic, depending on the reactance value of the coil portion 10. In place of the cylindrical form as shown in FIG. 4, the spool member 11 may be in the form of a rod or in I-shaped configuration. This spool member 11 is fixed on the circuit substrate 7 in the vicinity of the conductive paths 8 and 9 by a bonding agent 13. The coil portion 10 may be provided in hollow structure without the spool member 11.

As shown in FIG. 5, the insulated winding 12 is formed by a fine copper wire 121 of 50 to 800 $\phi$, the surface of which is coated with an insulating film 122 of urethane, Teflon, polyester or ethylene fluoride. The insulating film 122 is formed on the fine copper wire 121 through a solution of urethane or ethylene fluoride to be in thickness of about 10 to 50 $\mu$m (20 $\mu$m on average) thereby to effect insulation between respective winding portions of the coil portion 10. The insulated winding 12 is stored in a reel provided in an ultrasonic bonding apparatus as hereinafter described, to be fed from the reel toward the spool member 11.

The feature of the present invention resides in that the winding ends of the coil portion 10 are connected to the conductive paths 8 and 9 by ultrasonic vibration. In other words, the winding ends of the coil portion 10 are extended toward the conductive paths 8 and 9, and as shown in FIG. 6, a capillary chip 17 for supplying ultrasonic vibration of 20 to 60 KHz is placed on ends of the insulated winding 12 to apply ultrasonic vibration to the same. The insulating film 122 on the insulated winding 12 is locally heated by the ultrasonic vibration and thereby melted to partially expose the fine copper wire 121. When the insulating film 122 is made of urethane having a melting point of 180° C., the same is easily melted by the local heating through the ultrasonic vibration. The conductive paths 8 and 9 are made of copper similarly to the fine copper wire 121 of the insulated winding 12, and hence the same can be bonded to each other by the local heating through the ultrasonic vibration. Thus, the circuit substrate 7 is not heated as a whole by the ultrasonic vibration, and hence the insulating film 122 is not entirely melted and the insulated winding 12 of the coil portion 10 is not short-circuited.

When the circuit substrate 7 is prepared by an aluminum substrate processed with Alumite, the hard metal effectively traps the energy of the ultrasonic vibration thereby to enable ultrasonic bonding in a short time.

Figure 7:
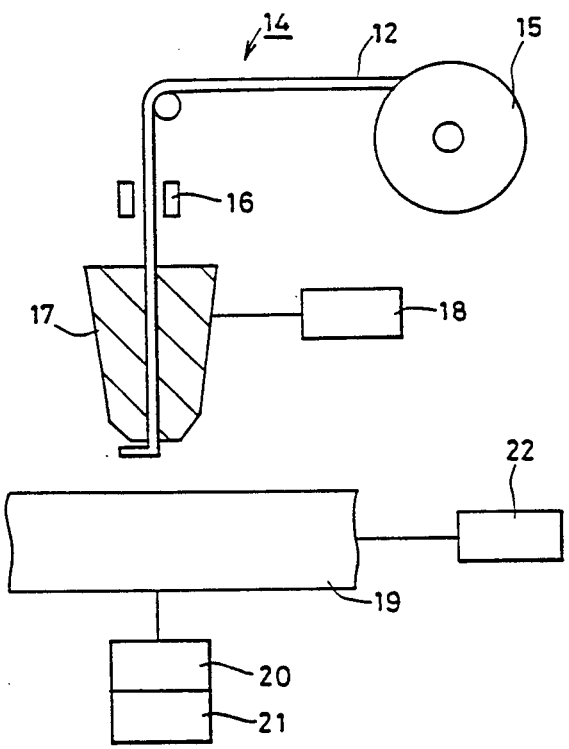
FIG. 7 is a schematic block diagram showing an ultrasonic bonding apparatus employed for manufacturing the coil according to the embodiment of the present invention.

FIG. 7 is a schematic block diagram showing an ultrasonic bonding apparatus employed for manufacturing the coil according to the embodiment of the present invention.

As shown in FIG. 7, the ultrasonic bonding apparatus employed in the present invention comprises a reel 15 storing insulated winding 12, a clamp 16, a capillary chip 17, an ultrasonic vibration source 18, a table 19, an X/Y-axis moving unit 20, a rotary unit 21 and a Z-axis moving unit 22. Such an ultrasonic bonding apparatus is well known in the art by, for example, U.S. Pat. No. 3,641,660, and is widely used for assembling semiconductor devices.

Description is briefly made on the operation of the ultrasonic bonding apparatus with reference to FIG. 7. An end of a fine aluminum bonding wire is extracted from a central opening of the capillary chip 17 to be secured to an electrode of a transistor or the like placed on the table 19 through ultrasonic vibration of 20 to 60 KHz, and then the capillary chip 17 is moved to apply ultrasonic vibration to the other end of the fine aluminum bonding wire to secure the same to another lead wire. The ultrasonic bonding apparatus employed in the present invention is formed by making following improvements on an apparatus for assembling a semiconductor device: First, the reel 15 stores the insulated winding 12 for forming the inductance element. Second, the power of the ultrasonic vibration source 18 is slightly higher than that for assembling the semiconductor device. Third, the table 19 is provided with the X/Y-axis moving unit 20 and the Z-axis moving unit 22, to be freely movable in directions X, Y and Z. Fourth, the table 19 is further provided with the rotary unit 21, to be rotatable about a desired coordinate on the X and Y axes.

FIGS. 8 to 11 are sectional views for illustrating a method of manufacturing an inductance element according to the present invention.

Figure 8:
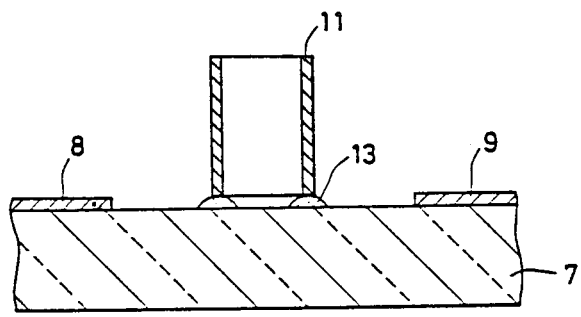
FIGS. 8 to 11 are sectional views for illustrating a method of manufacturing an inductance element according to the present invention.

Referring now to FIGS. 8 to 11, description is made on the method of manufacturing the inductance element according to the present invention. In a first step as shown in FIG. 8, the conductive paths 8 and 9 are formed on the circuit substrate 7 with arrangement of the spool member 11. In further detail, copper foil is selectively etched in desired patterns to form the conductive paths 8 and 9 while the spool member 11 is arranged on a predetermined region for forming an inductance element and fixed thereto by a bonding agent 13.

Figure 9:
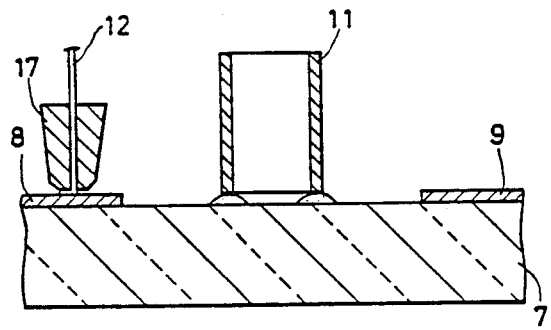

In a second step as shown in FIG. 9, an end of the insulated winding 12 is bonded by ultrasonic waves on one conductive path 8 through an ultrasonic bonding apparatus. In other words, the circuit substrate 7 is fixed on the table 19 of the ultrasonic bonding apparatus as described with reference to FIG. 7 by vacuum absorption. Then the table 19 is moved by the X/Y-axis moving unit 20 to locate the conductive path 8 directly under the capillary chip 17. Thereafter the capillary chip 7 is downwardly moved to bond the end of the insulated winding 12 on the conductive path 8 by ultrasonic vibration. The insulated winding 12 is formed by the fine copper wire 121 having a circular section, and hence the energy of the ultrasonic vibration is concentrated in the contact between the insulated winding 12 and the conductive path 8, whereby the insulating film 122 is broken to expose the fine copper wire 121. Thus, the fine copper wire 121 and the conductive path 8 are connected with each other by ultrasonic bonding, through coupling of copper forming the both members.

Figure 10:
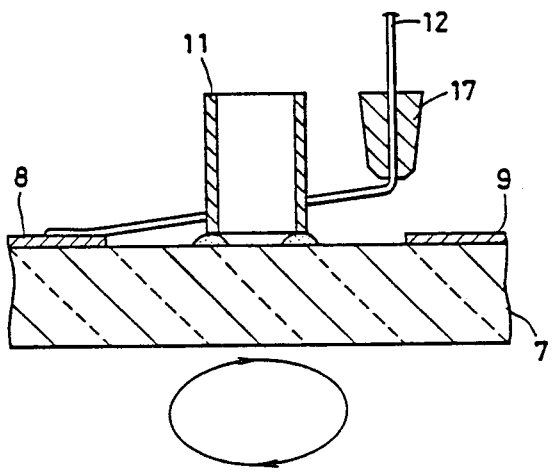

In a third step as shown in FIG. 10, the circuit substrate 7 is rotated to wind the insulated winding 12 around the spool member 11.

The insulated winding 12 is wound in a desired number of turns around the spool member 11, to form an inductance element having a desired inductance value. Since one end of the insulated winding 12 is bonded to the one conductive path 8, the circuit substrate 7 is moved by the X/Y-axis moving unit 20 to wind the insulated winding 12 around the spool member 11. Then the capillary chip 17 is moved through the X/Y-axis moving unit 20 to set the center of rotation at the center of the spool member 11 or around the same. Thereafter the rotary unit 21 of the ultrasonic bonding apparatus is driven to rotate the spool member 11 on the circuit substrate 7, thereby to uniformly wind the insulated winding 12 fed from the reel 15 in a prescribed number of turns.

In order to wind the insulated winding 12 around the spool member 11 in uniform thickness, the table 19 is vertically moved by the Z-axis moving unit 22 to adjust the vertical location of the spool member 11. According to the present invention, further, the spool member 11 is so rotated as to wind the insulated winding 12 in constant tensile force and arbitrarily set the number of its turns.

The manufacturing method is excellent in that the insulated winding 12 can be wound around the spool member 11 of both E-shaped and I-shaped types. In case of the I-shaped type, the vertical location of the capillary chip 17 may be adjusted in correspondence to the I-shaped spool member 11. In case of the E-shaped type, the capillary chip 17 may be arranged in a clearance of the E-shaped spool member 11.

Figure 11:
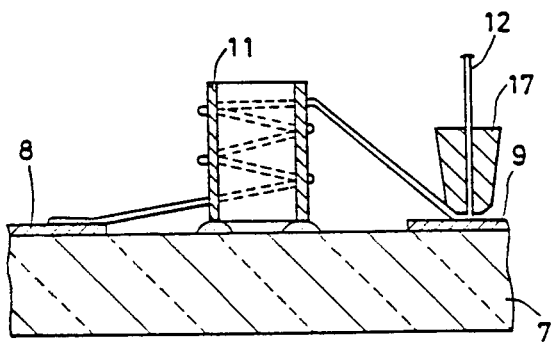

In a fourth step as shown in FIG. 11, the other end of the insulated winding 12 is bonded by ultrasonic waves to the other conductive path 9. In further detail, the table 19 of the ultrasonic bonding apparatus is so moved by the X/Y-axis moving unit 20 as to locate the capillary chip 17 on the other conductive path 9. Then the capillary chip 17 is downwardly moved to bring the other end of the insulated winding 12 in contact with the other conductive path 9 to apply ultrasonic vibration to the same. Thus, the other end of the insulated winding 12 is bonded on the other conductive path 9 by ultrasonic waves. The insulated winding 12 is severed by a cutter or the like when the capillary chip 17 is upwardly moved after the ultrasonic bonding.

Although the circuit substrate 7 is rotated about the capillary chip 17 in the third step as shown in FIG. 10, the circuit substrate 7 may be fixed to rotate the capillary chip 17 about the spool member 11, thereby to wind the insulated winding 12 around the spool member 11.

FIGS. 12 to 18 show sectional views for illustrating another example of the method of manufacturing inductance elements according to the present invention.

Figure 12:
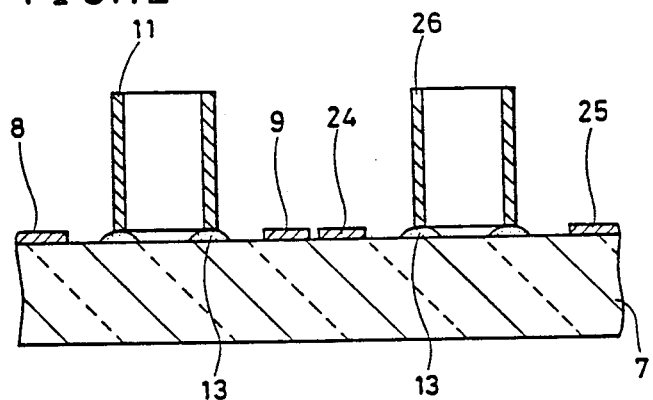
FIGS. 12 to 18 are sectional views for illustrating another example of the method of manufacturing inductance elements according to the present invention.

The example as shown in FIGS. 12 to 18 is adapted to continuously form a plurality of inductance elements. In a first step as shown in FIG. 12, a plurality of conductive paths 8, 9, 24 and 25 are provided on a circuit substrate 7 while spool members 11 and 26 are arranged on first and second positions respectively. The circuit substrate 7 and the spool members 11 and 26 are similar to those in FIG. 8.

Figure 13:
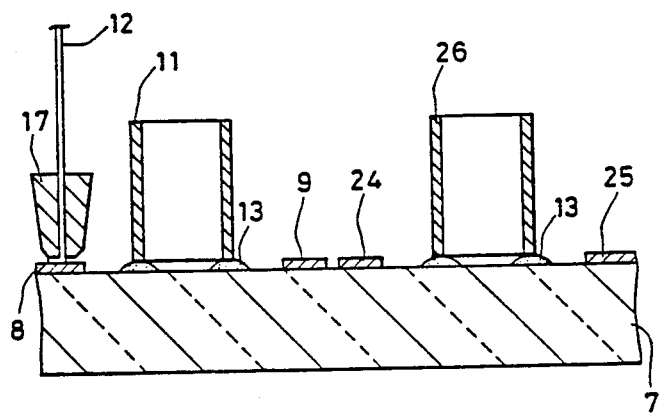

In a second step as shown in FIG. 13, an end of insulated winding 12 is ultrasonic-bonded on the conductive path 8 by a capillary chip 17, similarly to the example described above with reference to FIG. 9.

Figure 14:
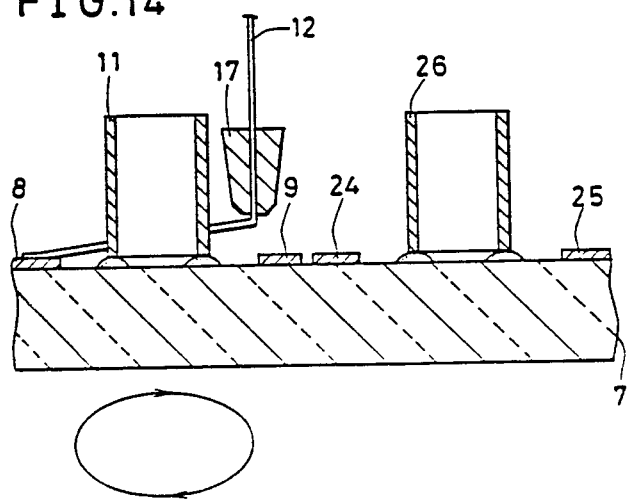

In a third step as shown in FIG. 14, the circuit substrate 7 is rotated to wind the insulated winding 12 around one spool member 11, similarly to the example described above with reference to FIG. 10.

Figure 15:
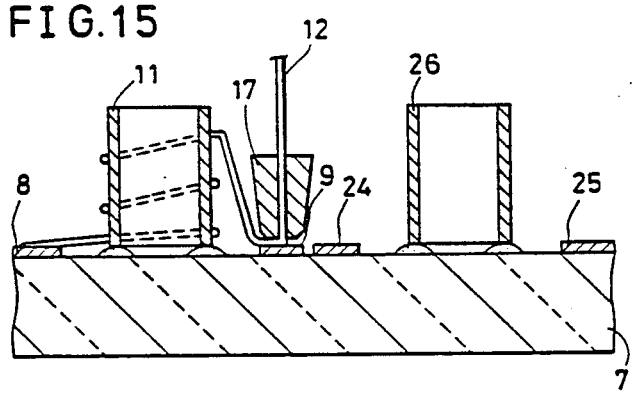

In a fourth step as shown in FIG. 15, the other end of the insulated winding 12 is ultrasonic-bonded on the conductive path 9 by the capillary chip 17, similarly to the example described above with reference to FIG. 11. After the ultrasonic bonding, the capillary chip 17 is upwardly moved and the insulated winding 12 is severed by a cutter etc., to complete a first inductance element.

Figure 16:
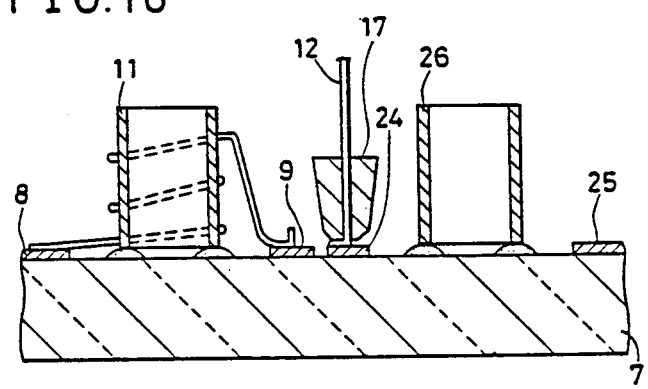

In a fifth step as shown in FIG. 16, a table 19 of an ultrasonic bonding apparatus is moved to bond one end of the insulated winding 12 on one conductive path 24 on the second position provided with the other spool member 26. In further detail, the table 19 of the ultrasonic bonding apparatus is moved by an X/Y-axis moving unit 20 to locate the capillary chip 17 on the one conductive path 24 in the second position provided with the other spool member 26. Then the capillary chip 17 is downwardly moved to bond one end of the insulated winding 12 to the conductive path 24 by ultrasonic vibration.

The feature of the fifth step resides in that the same is continuously performed immediately after completion of the first inductance element, thereby to enable continuous formation of a plurality of inductance elements.

Figure 17:
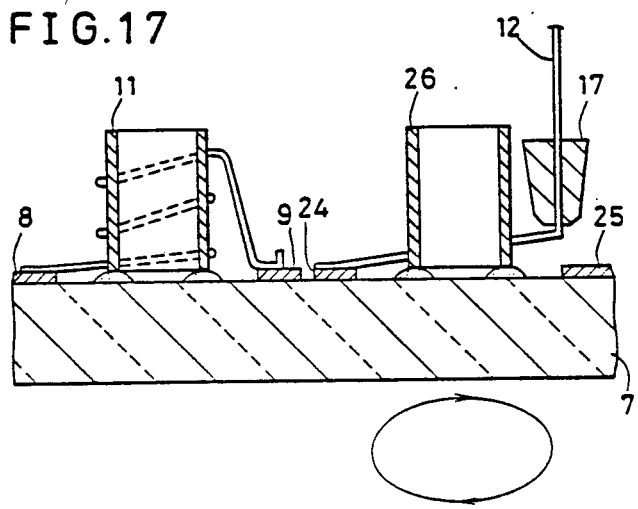

In a sixth step as shown in FIG. 17, the circuit substrate 7 is rotated to wind the insulated winding 12 around the other spool member 26. Similarly to the third step as shown in FIG. 14, the insulated winding 12 can be wound in a desired number of turns around the other spool member 26, thereby to form a second inductance element having a desired value.

The feature of the sixth step resides in that the reactance value of the second inductance element can be freely set by controlling the number of rotations of the circuit substrate 7. Thus, continuously formed at desire are a plurality of inductance elements having different reactance values.

Figure 18:
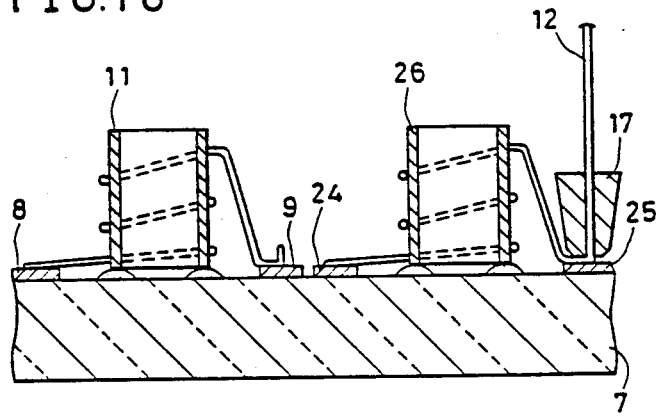

In a seventh step as shown in FIG. 18, the other end of the insulated winding 12 is bonded by ultrasonic waves to the other conductive path 25 on the second position provided with the other spool member 26. Similarly to the fourth step as shown in FIG. 15, the table 19 of the ultrasonic bonding apparatus is moved by the X/Y-axis moving unit 20, to locate the capillary chip 17 on the other conductive path 25 in the second position. Then the capillary chip 17 is downwardly moved to bring the insulated winding 12 in contact with the conductive path 25 and apply ultrasonic vibration, thereby to bond the other end of the insulated winding 12 to the conductive path 25 by ultrasonic waves. After completion of the ultrasonic bonding, the insulated winding 12 is cut when the capillary chip 17 is upwardly moved. Thus, completed is formation of a second inductance element.

According to the manufacturing method as hereinabove described, a plurality of inductance elements can be continuously formed on desired positions of the circuit substrate 7 by movement the table 19 of the ultrasonic bonding apparatus. Further, inductance elements having values required for hybrid integrated circuits can be formed in arbitrary order on the circuit substrate 7 by controlling a rotary unit 21 for rotating the table 19.

FIGS. 19 to 23 are sectional views for illustrating still another example of the method of manufacturing an inductance element according to the present invention.

In this example, an inductance element is manufactured without heating processing by winding insulated winding 12 by an ultrasonic bonding apparatus, in view of the fact that the insulated winding 12 can be directly bonded on a conductive path 8 by ultrasonic waves after other circuit elements are soldered to conductive paths 8 and 27.

Figure 19:
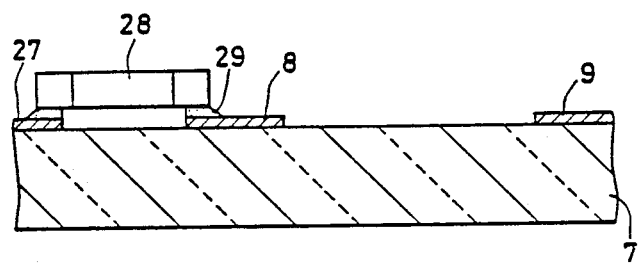
FIGS. 19 to 23 are sectional views for illustrating still another example of the method of manufacturing an inductance element according to the present invention.

In a first step as shown in FIG. 19, conductive paths 8, 9 and 27 are formed on a circuit substrate 7 while a circuit element 28 is soldered to the conductive paths 8 and 27. The circuit substrate 7 and the conductive paths 8, 9 and 27 are identical to those in FIG. 8. The circuit element 28 is a component required to form a hybrid integrated circuit, such as an IC chip, transistor chip, chip capacitor or chip resistor.

In the first step, solder cream is selectively screen-printed on the conductive paths 8 and 27 to be soldered with the circuit element 28. Then the circuit element 28 is placed on a prescribed position so that the circuit substrate 7 is entirely heated in a furnace or on a hot plate to connect the circuit element 28 with the conductive paths 8 and 27 by a solder layer 29.

Figure 20:
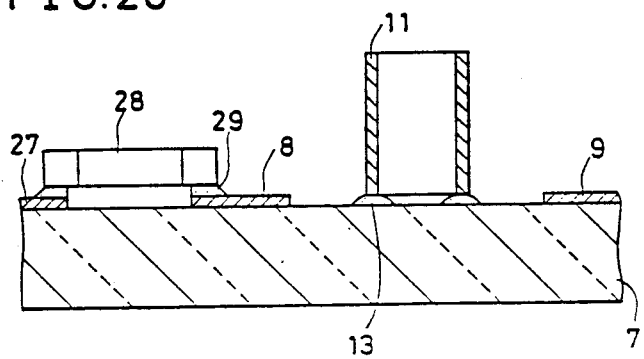

In a second step as shown in FIG. 20, a spool member 11 is placed on the circuit substrate 7. The spool member 11 is identical to that shown in FIG. 8.

Figure 21:
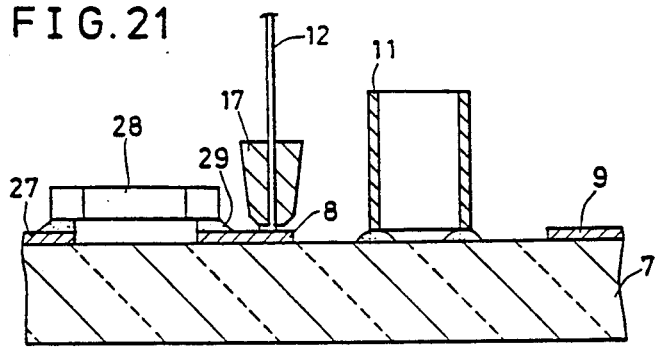

In a third step as shown in FIG. 21, an end of the insulated winding 12 is bonded on one conductive path 8 by ultrasonic waves, similarly to that described with reference to FIG. 9.

Figure 22:
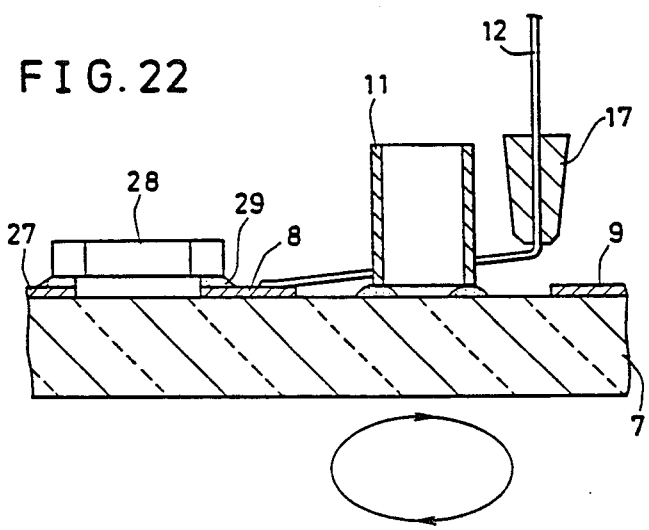

In a fourth step as shown in FIG. 22, the circuit substrate 7 is rotated to wind the insulated winding 12 around the spool member 11. This step is performed in a similar manner to that shown in FIG. 10.

Figure 23:
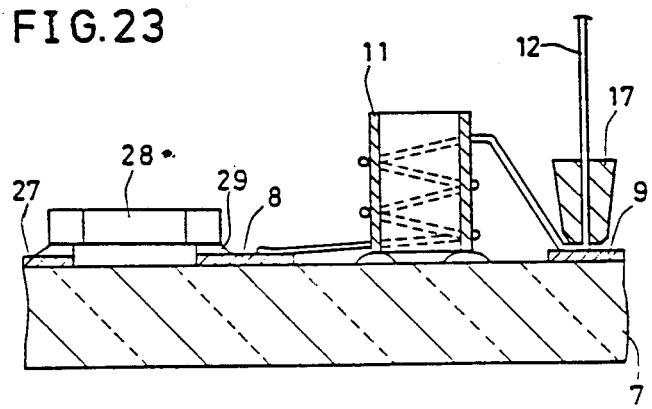

In a fifth step as shown in FIG. 23, the other end of the insulated winding 12 is bonded on the other conductive path 9, similarly to the step as shown in FIG. 11.

According to the present invention as hereinabove described, the inductance element can be assembled on the circuit substrate 7 in addition to the circuit element 28 generally assembled thereon such as an IC chip, a transistor, a chip capacitor or a chip resistor, thereby to substantially remove necessity for external components. Further, the inductance element is assembled on the circuit substrate after termination of a heating process for soldering, and hence no short circuit is caused by heating of the insulated winding 12.

Figure 24:
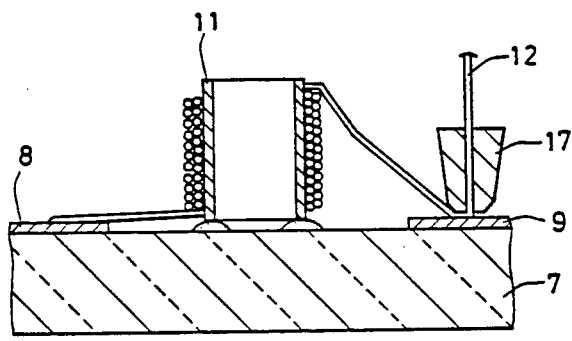
FIG. 24 is a sectional view for illustrating a further example of the method of manufacturing an inductance element according to the present invention.

FIG. 24 is a sectional view for illustrating a still further example of the method of manufacturing an inductance element according to the present invention. In the example as shown in FIG. 24, first and second steps are performed similarly to those shown in FIGS. 8 and 9.

Then, in a third step, insulated winding 12 fed from a reel 15 is uniformly wound around a spool member 11 with a circuit substrate 7 being vibrated in a vertical direction as shown in FIG. 24. In further detail, a table 19 is vertically vibrated in a constant cycle to wind the insulated winding around the entire spool member 11 in uniform thickness. As the result, the spool member 11 can be formed in small size even if the inductance element has a great number of turns.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an inductance element, which comprises:
   a first step of preparing a substrate provided with two conductive paths;
   a second step of mounting insulated wire of conductive material coated with an insulating layer on a reel of an ultrasonic bonding apparatus;
   a third step of feeding said insulated wire from said reel of said ultrasonic bonding apparatus and locally heating an end thereof and ultrasonic bonding the same on one of said conductive paths provided on said substrate by applying ultrasonic vibration to said end;
   a fourth step of feeding said insulated wire to form a coil; and
   a fifth step of ultrasonically - bonding the other end of said insulated wire on the other of said conductive paths provided on said substrate;
   wherein said first step includes a step of forming a spool member on said substrate, and
   said fourth step includes a step of winding said insulated wire around said spool member, and wherein
   said bonding apparatus includes a capillary chip for holding an end of said insulated wire fed from said reel,
   said third step includes a step of locating said capillary chip of said bonding apparatus on said one conductive path to bond an end of said insulated wire on said one conductive path,
   said fourth step includes a step of locating said capillary chip around the periphery of said spool member from said location on said one conductive path and rotating said chip about said periphery of said spool member thereby to wind said insulated wire around said spool member, and
   said fifth step includes a step of, after winding said insulated wire around said spool member, locating said capillary chip on said other conductive path to bond the other end of said insulated wire on said other conductive path.

2. A method of manufacturing an inductance element in accordance with claim 1, wherein
   said step of forming said coil includes a step of rotating said capillary chip.

3. A method of manufacturing an inductance element in accordance with claim 1, wherein
   said step of forming said coil includes a step of rotating said substrate.

4. A method of manufacturing an inductance element in accordance with claim 1, wherein
   said bonding apparatus includes a vertically movable table for receiving said substrate;

said fourth step including a step of vertically moving said table to wind said insulated wire in uniform thickness.

5. A method of manufacturing an inductance element in accordance with claim 1, wherein
said conductive material for said insulated wire and that for said conductive paths are the same metal.

6. A method of manufacturing an inductance element in accordance with claim 5, wherein
said metal is copper.

7. A method of manufacturing an inductance element in accordance with claim 1, wherein
said first step includes a step of soldering a circuit element to at least one of said two conductive paths.

8. A method of manufacturing an inductance element, which comprises
a first step of preparing a substrate provided with two conductive paths;
a second step of mounting insulated wire of conductive material coated with an insulating layer on a reel of an ultrasonic bonding apparatus;
a third step of feeding said insulated wire from said reel of said ultrasonic bonding apparatus and locally heating an end thereof and ultrasonic bonding the same on one of said conductive paths provided on said substrate by applying ultrasonic vibration to said end;
a fourth step of feeding said insulated wire to form a coil; and
a fifth step of ultrasonically - bonding the other end of said insulated wire on the other of said conductive paths provided on said substrate;
wherein said first step includes a step of forming a spool member on said substrate, and
said fourth step includes a step of winding said insulated wire around said spool member, and wherein
said bonding apparatus includes a capillary chip for holding an end of said insulated wire fed from said reel,
said third step includes a step of locating said capillary chip of said bonding apparatus on said one conductive path to bond an end of said insulated wire on said one conductive path,
said fourth step includes a step of locating said capillary chip around the periphery of said spool member from said location on said one conductive path and rotating said substrate to rotate said spool member thereby to wind said insulated wire around said spool member, and
said fifth step includes a step of, after winding said insulated wire around said spool member, locating said capillary chip on said other conductive path to bond the other end of said insulated wire on said other conductive path.

9. A method of manufacturing an inductance element, which comprises
a first step of preparing a substrate provided with two conductive paths;
a second step of mounting insulated wire of conductive material coated with an insulating layer on a reel of an ultrasonic bonding apparatus;
a third step of feeding said insulated wire from said reel of said ultrasonic bonding apparatus and locally heating an end thereof and ultrasonic bonding the same on one of said conductive paths provided on said substrate by applying ultrasonic vibration to said end;
a fourth step of feeding said insulated wire to form a coil; and
a fifth step of ultrasonically - bonding the other end of said insulated wire on the other of said conductive paths provided on said substrate, and wherein
said bonding apparatus includes a capillary chip for holding an end of said insulated wire fed from said reel and a table movable in directions of first and second horizontal axes perpendicular to each other, said table receiving said substrate,
said third step includes a step of moving said table in the direction of said first of second horizontal axis to locate said capillary chip on said one conductive path,
said fourth step includes a step of, after bonding said end of said insulated wire on said one conductive path in said third step, moving said table in the direction of said first or second horizontal axis to locate said capillary chip in a prescribed position on said substrate, and
said fifth step includes a step of, after winding said insulated wire in said fourth step, moving said table in the direction of said first or second horizontal axis to locate said capillary chip on said other conductive path.

10. A method of manufacturing inductance elements, which comprises:
a first step of preparing a substrate provided with two conductive paths;
a second step of mounting an insulated wire of conductive material coated with an insulating layer on a reel of a bonding apparatus;
a third step of feeding said insulated wire from said reel bonding an end thereof on one of said conductive paths provided on said substrate;
a fourth step of winding said insulated wire in a first position on said substrate to form a first coil;
a fifth step of winding said insulated wire in a second position on said substrate to form a second coil; and
a sixth step of bonding the other end of said insulated wire on the other one of said two conductive paths, and wherein
said bonding apparatus includes a capillary chip for holding an end of said insulated wire fed from said reel,
said fourth step includes a step of changing relative connection between said substrate and said capillary chip and winding said insulated wire to form said first coil, and
said fifth step includes a step of changing said relative connection between said substrate and said capillary chip and winding said insulated wire to form said second coil.

11. A method of manufacturing inductance elements in accordance with claim 10, wherein
said steps of forming said first and second coils include steps of rotating said capillary chip.

12. A method of manufacturing inductance elements in accordance with claim 10, wherein
said steps of forming said first and second coils include steps of rotating said substrate.

13. A method of manufacturing inductance elements in accordance with claim 10, wherein
said third step includes a step of locating said capillary chip of said bonding apparatus on said one conductive path to bond said end of said insulated wire on said one conductive path, said fourth step includes a step of locating said capillary chip around the periphery of one of said spool members from said location on said one conductive path and rotating said periphery of said one spool member to wind said insulated wire around said one spool member, said fifth step includes a step of locating said capillary chip around the periphery of the other said spool member from said location around said periphery of said one spool member and rotating said periphery of said other spool member to wind said insulated wire around said other spool member, and said sixth step includes a step of, after winding said insulated wire around said other spool member, locating said capillary chip on said other conductive path to bond the other end of said insulated wire on said other conductive path.

14. A method of manufacturing inductance elements in accordance with claim 10, wherein said third step includes a step of locating said capillary chip of said bonding apparatus on said one conductive path to bond said end of said insulated wire on said one conductive path, said fourth step includes a step of locating said capillary chip around the periphery of one of said spool members from said location on said one conductive path and rotating said substrate to rotate said one spool member along the circumference of said capillary chip thereby to wind said insulated wire around said one spool member, said fifth step includes a step of locating said capillary chip around the periphery of the other said spool member from said location around said periphery of said one spool member and rotating said substrate to rotate said other spool member along the circumference of said capillary chip thereby to wind said insulated wire around said other spool member, and said sixth step includes a step of, after winding said insulated wire around said other spool member, locating said capillary chip on said other conductive path to bond the other end of said insulated wire on said other conductive path.

\* \* \* \* \*